United States Patent
Ernst et al.

(10) Patent No.: US 6,839,397 B2
(45) Date of Patent: Jan. 4, 2005

(54) CIRCUIT CONFIGURATION FOR GENERATING CONTROL SIGNALS FOR TESTING HIGH-FREQUENCY SYNCHRONOUS DIGITAL CIRCUITS

(75) Inventors: Wolfgang Ernst, München (DE); Gunnar Krause, München (DE); Justus Kuhn, München (DE); Jens Lüpke, München (DE); Jochen Müller, München (DE); Peter Pöchmüller, München (DE); Michael Schittenhelm, Poing (DE)

(73) Assignee: Infineon Technologies AG, Munich (DE)

(*) Notice: Subject to any disclaimer, the term of this patent is extended or adjusted under 35 U.S.C. 154(b) by 708 days.

(21) Appl. No.: 09/907,784

(22) Filed: Jul. 18, 2001

(65) Prior Publication Data
US 2002/0010878 A1 Jan. 24, 2002

(30) Foreign Application Priority Data
Jul. 18, 2000 (DE) .......... 100 34 851

(51) Int. Cl.$^7$ .......... G06M 3/00
(52) U.S. Cl. .......... 377/19; 377/26; 377/54; 714/700; 714/731; 714/744

(58) Field of Search .......... 377/19, 26, 54; 714/700, 731, 744

(56) References Cited

U.S. PATENT DOCUMENTS 5,504,756 A * 4/1996 Kim et al. .......... 714/729
5,651,014 A * 7/1997 Kobayashi .......... 714/744

FOREIGN PATENT DOCUMENTS

JP 05264667 A 10/1993

* cited by examiner

*Primary Examiner*—Margaret R. Wambach
(74) *Attorney, Agent, or Firm*—Laurence A. Greenberg; Werner H. Stemer; Gregory L. Mayback

(57) ABSTRACT

A circuit configuration for generating control signals for testing high-frequency synchronous digital circuits, especially memory chips, is described. A p-stage shift register which is clocked at a clock frequency corresponding to the high clock frequency of the digital circuit to be tested has connected to its parallel loading inputs p logical gates which logically combine a static control word with a dynamic n-position test word. The combined logical value is loaded into the shift register at a low-frequency loading clock rate so that a control signal, the value of which depends on the information loaded into the shift register in each clock cycle of the clock frequency of the latter is generated at the serial output of the shift register.

11 Claims, 1 Drawing Sheet

CIRCUIT CONFIGURATION FOR GENERATING CONTROL SIGNALS FOR TESTING HIGH-FREQUENCY SYNCHRONOUS DIGITAL CIRCUITS

BACKGROUND OF THE INVENTION

Field of the Invention

The invention relates to a circuit configuration for generating control signals for testing high-frequency synchronous digital circuits, especially memory chips.

The clock frequency of modern synchronous memory chips exceeds the signal frequency of tester systems currently used in production. To check the specification of memory chips which are in production, the "data mask" control signals must be generated at the maximum operating frequency of the memory chip for each group of data lines.

So that the memory chip does not have to be tested at a reduced clock frequency predetermined by the existing tester system and no new test systems must be acquired which are adapted to the high clock frequency, there is thus a demand for an inexpensive circuit configuration which is easy to implement and by which control signals for checking the specification of high-frequency synchronous digital circuits and especially of synchronous memory chips can be generated at a clock frequency which corresponds to the high-frequency clock period of the digital circuit to be checked and may be a multiple thereof.

SUMMARY OF THE INVENTION

It is accordingly an object of the invention to provide a circuit configuration for generating control signals for testing high-frequency synchronous digital circuits that overcome the above-mentioned disadvantages of the prior art devices and methods of this general type.

With the foregoing and other objects in view there is provided, in accordance with the invention, a circuit configuration for generating control signals for testing high-frequency synchronous digital circuits, including memory chips. The circuit configuration includes a p-stage shift register clocked at a clock frequency corresponding to a high clock frequency of a digital circuit to be tested. The p-stage shift register has parallel loading inputs and a serial output. P logical gates are connected to the parallel loading inputs of the p-stage shift register. The logical gates receive and logically combine a static control word with an n-position dynamic test word in order to load a combined logical value into the p-stage shift register at a low-frequency loading clock rate so that, at the serial output of the p-stage shift register, a control signal is generated, a value of the control signal depending on information loaded into the p-stage shift register in each clock cycle of the high clock frequency.

The basic concept of the present invention for achieving the above object consists in connecting a circuit configuration, which is set up for generating control signals, between an existing tester and the synchronous digital circuit, especially memory chips, to be tested in which the signal frequencies of the tester and of the memory chip differ by a factor of p.

The proposed circuit configuration allows m control signals to be generated by use of n signals from the tester in that control words which control the significance of the tester signals are stored or are being stored in the semiconductor circuit.

For this purpose, the circuit configuration according to the invention has as essential elements a p-stage shift register.

The shift register is clocked at a clock frequency corresponding to the high clock frequency of the digital circuit to be tested or is derived therefrom. At parallel loading inputs of the shift register, p logical gates are provided which logically combine a static control word with an n-position dynamic test word and load the combined logical value into the shift register at a low-frequency loading clock corresponding to the operating frequency of the tester so that, at the serial output, a control signal, the value of which in each case depends on the information loaded into the shift register, can be activated in each case at the clock frequency of the shift register.

In an exemplary embodiment, the number of stages p of the shift register is twice the number of digits of the test word supplied by the tester (i.e. p=2n), for example, p=8 shift register stages and n=4 bit positions of the test word are provided.

In the exemplary embodiment, the logical gates are AND gates having in each case two inputs. In this way, each bit position of the test word from the tester goes to p/n AND gates, that is to say to two AND gates, in the preferred embodiment, which are disposed in front of two of the parallel loading inputs of the shift register. The second inputs of the AND gates are connected to one bit position each of a control word in such a manner that one bit position each drives one AND gate of the two AND gates connected in parallel for each test word bit position.

In an optional further development of the circuit configuration according to the invention, the serial output of the shift register is connected to an input of a switchable delay element. The switching input of which is connected to another bit position of the control word in such a manner that the bit position defines whether the serial output of the shift register is delayed by one clock cycle of the shift clock of the shift register, or not.

Furthermore, the circuit configuration according to the invention can optionally have masking elements at the output of the shift register or at the output of the delay element, and further bit positions of the control word are applied to inputs of the masking elements in order to mask the control signal, which is present at the serial output of the shift register or generated delayed by the delay element, as determined by these further bit positions of the control word.

The masking elements preferably consist of two-input AND gates that are connected in parallel with respect to the control signal at the serial output of the shift register or the control signal delayed by the delay element.

In further parallel applications by the same applicant, a build outside self test (BOST) concept for testing high-frequency digital circuits, especially DRAM memories, is described which will allow the continued use of the tester systems hitherto used with their relatively low operating frequencies and, nevertheless, by moving various tester functions into an ASIC chip, which can be produced inexpensively, and with it into the vicinity of the circuit to be tested, the direct and inexpensive testing of its signal specifications which are highly accurate with respect to timing. For the circuit configuration described here, too, an implementation is to be preferred in which it is contained in such an integrated semiconductor circuit which is configured as BOST solution and which is inserted between the digital circuit to be tested and a conventional test device. This circuit configuration is supplied with the test word from the test device at a relatively low operating frequency and the control signal generated by the circuit configuration is supplied at the high frequency to the digital circuit to be tested.

In accordance with an added feature of the invention, an integrated semiconductor circuit is provided and contains the p-stage shift register and the logical gates. The p-stage shift register has an input receiving the low-frequency loading clock rate. The integrated semiconductor circuit is inserted between the digital circuit to be tested and a conventional test device. The n-position dynamic test word and the low-frequency loading clock rate of the p-stage shift register are transmitted from the conventional test device to the integrated semiconductor circuit and the control signal generated is conducted to the digital circuit to be tested.

In accordance with a further feature of the invention, the clock frequency for the p-stage shift register is generated by doubling a frequency of a clock of the digital circuit to be tested.

With the foregoing and other objects in view there is provided, in accordance with the invention, a method for generating data mask control signals for testing data lines of a synchronous dynamic random access memory (DRAM) chip. The method includes providing a circuit configuration for generating the data mask control signals. The circuit configuration contains a p-stage shift register clocked at a clock frequency corresponding to a high clock frequency of the synchronous DRAM chip to be tested. The p-stage shift register having parallel loading inputs and a serial output. P logical gates are connected to the parallel loading inputs of the p-stage shift register. The logical gates receive and logically combine a static control word with an n-position dynamic test word in order to load a combined logical value into the p-stage shift register at a low-frequency loading clock rate so that, at the serial output of the p-stage shift register, a control signal is generated, a value of the control signal depending on information loaded into the p-stage shift register in each clock cycle of the high clock frequency.

Other features which are considered as characteristic for the invention are set forth in the appended claims.

Although the invention is illustrated and described herein as embodied in a circuit configuration for generating control signals for testing high-frequency synchronous digital circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The single FIGURE of the drawing is a circuit diagram of a BOST circuit according to the invention.

DESCRIPTION OF THE PREFERRED EMBODIMENTS

Figure 1:
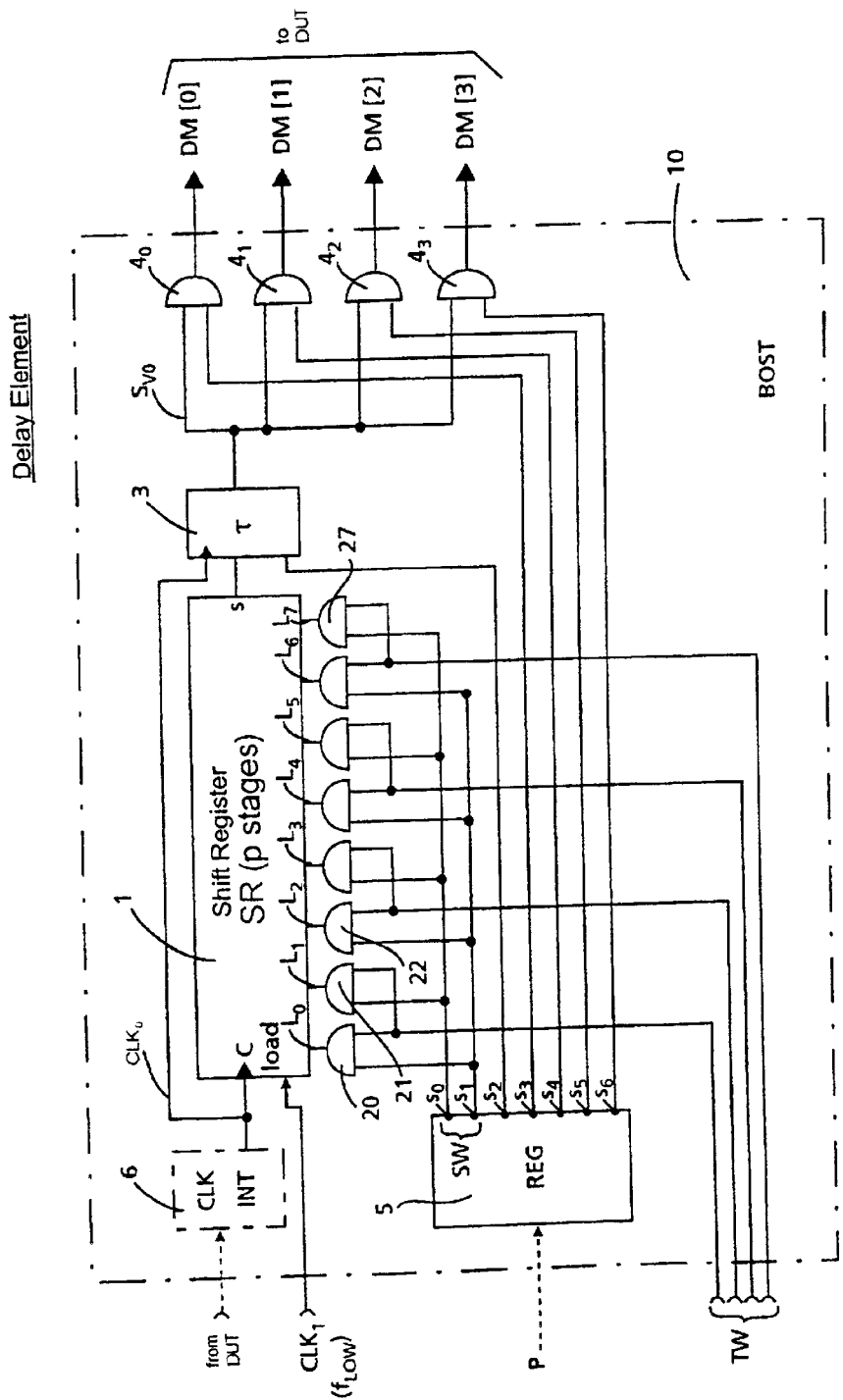

Referring now to the single FIGURE of the drawing in detail, there is shown a circuit configuration according to the invention, implemented in a build outside self test (BOST) circuit 10. The circuit configuration exhibits a p-stage (for example, 8-stage) shift register (SR) 1. Parallel loading inputs $L_0$–$L_7$ of the shfit register 1 are connected in front of p AND gates 20–27 which are used as logical gates for combining two bits s0, s1 of a control word SW with an n-stage test word TW from the test device. Each bit position of the test word TW is applied in parallel to a first input of two AND gates, namely 20, 21; 22, 23; 24, 25 and 26, 27. Of these two AND gates, which are connected in parallel with respect to the bit position of the test word, the first AND gates in each case receive the first position s0 and the second AND gates receive the second bit position s1 of the control word SW. A loading clock CLK1 supplied to a loading clock input LOAD of the shift register 1 has a low frequency $f_{low}$ that is derived from a low tester clock frequency. The content generated in the shift register 1 by combining the two bit positions s0 and s1 of the control word SW with the n bit positions of the test word TW and loaded into the shift register 1 is available at its serial output S at the frequency of a clock signal CLK0 present at a clock input C of the shift register 1. The high-frequency clock signal CLK0 can be derived from the clock signal of the digital circuit to be tested DUT, especially the memory chip to be tested DUT, for example by doubling the clock frequency of the operating clock of the DUT in an internal BOST clock generator 6.

The exemplary embodiment shown in the FIGURE also exhibits in the BOST chip 10 an optional delay element 3 that is supplied with a serial output S of the shift register 1. The delay element 3 receives at an input a switching signal which forms a further bit position s2 of the control word SW. The further bit position s2 of the control word SW thus defines whether the control signal output at the serial output S of the shift register 1 is delayed by one clock cycle of the high-frequency shift clock CLK0, or not.

Furthermore, the FIGURE shows masking elements $4_0$–$4_3$ which are optionally provided for the circuit configuration according to the invention and which receive in parallel the control signal from the shift register 1 or the control signal $S_{v0}$ delayed by the delay element 3 and optionally mask the control signal by further bit positions s3–s6 of the control word SW which are present at the other inputs of the masking elements $4_0$–$4_3$, and generate from this a masked 4-bit data mask signal DM[0], DM[1], DM[2], DM[3]. The masking elements $4_0$–$4_3$ are two-input AND gates in the exemplary embodiment shown.

The static control word SW can by stored programmably in a register 5 provided in the BOST 10. To program the register 5, a programming signal can be transmitted from the outside, for example from the test device.

The expert will recognize that the exemplary embodiment of the circuit configuration according to the invention, shown in the FIGURE, only illustrates a principle of operation and that various types of implementation of such a circuit configuration are possible. The number p of stages of the shift register 1 (for example, 8) and the number n of bit positions of the test word (for example, 4) are also only examples.

The above description shows that, instead of an expensive high-frequency tester system or instead of a low-frequency tester system, the tester signals of which are serialized at high frequency by multiplexers via an ASIC chip, a sufficiently flexible and inexpensive signal generation for specification tests of synchronous digital circuits, especially semiconductor memory chips, is made possible by cleverly combining a few tester signals with a control word stored in a register in the semiconductor circuit configuration according to the invention.

We claim:

1. A circuit configuration for generating control signals for testing high-frequency synchronous digital circuits, including memory chips, the circuit configuration comprising:

a p-stage shift register clocked at a clock frequency corresponding to a high clock frequency of a digital circuit to be tested, said p-stage shift register having parallel loading inputs and a serial output; and p logical gates connected to said parallel loading inputs of said p-stage shift register, said logical gates receive and logically combine a static control word with an n-position dynamic test word in order to load a combined logical value into said p-stage shift register at a low-frequency loading clock rate so that, at said serial output of said p-stage shift register, a control signal is generated, a value of the control signal depending on information loaded into said p-stage shift register in each clock cycle of the high clock frequency.

2. The circuit configuration according to claim 1, wherein p=2 n.

3. The circuit configuration according to claim 1, wherein p=8 and n=4.

4. The circuit configuration according to claim 1, wherein said logical gates are AND gates having in each case a first input and a second input, and that each bit position of the n-position dynamic test word is present in parallel at said first input of p/n of said AND gates and bit positions of the static control word are in each case present at said second input of all of said AND gates.

5. The circuit configuration according to claim 4, wherein two bit positions of the static control word are applied to said second input of in each case those of said AND gates which are connected in parallel with respect to each bit position of the n-position dynamic test word.

6. The circuit configuration according to claim 1, including a switchable delay element having inputs, said serial output of said p-stage shift register connected to one of said inputs of said switchable delay element, another of said inputs of said switchable delay element is connected to a further bit position of the static control word in such a manner that the further bit position defines whether said serial output of said p-stage shift register is delayed by one clock cycle of the clock frequency, or not.

7. The circuit configuration according to claim 6, including masking elements having inputs connected to said delay element, still further bit positions of the static control word are in each case supplied to said inputs of said masking elements for one of masking the control signal generated at said serial output of said p-stage shift register and delaying the control signal by said delay element resulting in a delayed control signal.

8. The circuit configuration according to claim 7, wherein said masking elements are two-input AND gates connected in parallel with respect to the control signal or the delayed control signal.

9. The circuit configuration according to claim 1, including an integrated semiconductor circuit containing said p-stage shift register and said logical gates, said p-stage shift register having an input receiving the low-frequency loading clock rate, said integrated semiconductor circuit is inserted between the digital circuit to be tested and a conventional test device, the n-position dynamic test word and the low-frequency loading clock rate of said p-stage shift register being transmitted from the conventional test device to said integrated semiconductor circuit and the control signal generated being conducted to the digital circuit to be tested.

10. The circuit configuration according to claim 1, wherein the clock frequency for said p-stage shift register is generated by doubling a frequency of a clock of the digital circuit to be tested.

11. A method for generating data mask control signals for testing data lines of a synchronous dynamic random access memory (DRAM) chip, which comprises:

providing a circuit configuration for generating the data mask control signals, the circuit configuration including:

a p-stage shift register clocked at a clock frequency corresponding to a high clock frequency of the synchronous DRAM chip to be tested, the p-stage shift register having parallel loading inputs and a serial output; and p logical gates connected to the parallel loading inputs of the p-stage shift register, the logical gates receive and logically combine a static control word with an n-position dynamic test word in order to load a combined logical value into the p-stage shift register at a low-frequency loading clock rate so that, at the serial output of the p-stage shift register, a control signal is generated, a value of the control signal depending on information loaded into the p-stage shift register in each clock cycle of the high clock frequency.

* * * * *